(12) United States Patent
Itoh (10) Patent No.: US 7,551,437 B2
(45) Date of Patent: Jun. 23, 2009

(54) COOLING MECHANISM FOR CIRCUIT BOARD

(75) Inventor: Shinji Itoh, Osaka (JP)

(73) Assignee: Kyocera Mita Corporation (JP)

( * ) Notice: Subject to any disclaimer, the term of this patent is extended or adjusted under 35 U.S.C. 154(b) by 236 days.

(21) Appl. No.: 11/509,235

(22) Filed: Aug. 24, 2006

(65) Prior Publication Data

US 2007/0047202 A1 Mar. 1, 2007

(30) Foreign Application Priority Data

Aug. 26, 2005 (JP) ............................. 2005-245145

(51) Int. Cl.
*H05K 7/20* (2006.01)
*F28F 7/00* (2006.01)
*H01B 7/42* (2006.01)

(52) U.S. Cl. ................. 361/697; 361/695; 361/719; 361/720; 165/80.2; 174/16.1; 174/16.3; 257/713; 257/721

(58) Field of Classification Search ......... 361/694–695, 361/718–720, 753, 818, 831; 257/721; 174/16.1, 174/16.3; 165/80.2

See application file for complete search history.

(56) References Cited

U.S. PATENT DOCUMENTS

| | | | | |
|---|---|---|---|---|
| 5,831,847 | A * | 11/1998 | Love | 363/141 |
| 5,969,941 | A * | 10/1999 | Cho | 361/687 |
| 6,400,563 | B1 * | 6/2002 | Mohi et al. | 361/683 |
| 6,483,699 | B1 * | 11/2002 | Salmonson et al. | 361/687 |
| 6,515,858 | B2 * | 2/2003 | Rodriguez et al. | 361/695 |
| 6,930,883 | B2 * | 8/2005 | Hsieh et al. | 361/695 |
| 7,180,739 | B2 * | 2/2007 | Kajiura | 361/695 |
| 7,220,178 | B2 * | 5/2007 | Chang | 454/184 |
| 7,319,474 | B2 * | 1/2008 | Senga | 347/223 |
| 7,345,873 | B2 * | 3/2008 | Dey et al. | 361/695 |
| 2002/0036889 | A1 * | 3/2002 | Ruiz-Gomez et al. | 361/695 |
| 2002/0094772 | A1 * | 7/2002 | Gough | 454/184 |
| 2005/0105270 | A1 * | 5/2005 | Senga | 361/695 |
| 2005/0146851 | A1 * | 7/2005 | Kajiura | 361/695 |
| 2008/0106866 | A1 * | 5/2008 | Hori et al. | 361/695 |

FOREIGN PATENT DOCUMENTS

| | | |
|---|---|---|
| JP | 8-125363 | 5/1996 |
| JP | 2000-332474 | 11/2000 |
| JP | 2002-182545 | 6/2002 |

* cited by examiner

*Primary Examiner*—Jayprakash N Gandhi
*Assistant Examiner*—Zachary M Pape
(74) *Attorney, Agent, or Firm*—Gerald E. Hespos; Anthony J. Casella (57) ABSTRACT

A cooling mechanism for a circuit board includes a board having electronic components disposed thereon, one or more heat radiation plates disposed on the board, a cooling fan for cooling the board and the electronic components disposed on the board by blowing air to at least one of the heat radiation plates, and a metal plate attached to one end of the board to ground the board, thereby preventing the leakage of electromagnetic radiation noises from the electronic components. Further, the metal plate includes a bent portion bent in L-shape along a lateral side of the board, and the cooling fan is so disposed at the inner side of the bent portion as to be perpendicular to the board. Furthermore, an air receiving surface of the heat radiation plate is so arranged as to be oblique to an axial blowing direction of the cooling fan.

6 Claims, 6 Drawing Sheets

COOLING MECHANISM FOR CIRCUIT BOARD

BACKGROUND OF THE INVENTION

1. Field of the Invention

The present invention relates to a cooling mechanism for a circuit board used in an electronic apparatus provided with a plurality of electronic components and particularly to a mechanism for cooling the respective electronic components using a cooling fan.

2. Description of the Background Art

In electronic apparatuses such as copiers, personal computers and televisions, various circuit boards each having a plurality of electronic components mounted on a board are used. Since such circuit boards generally produce heat as the electronic apparatus operate, a cooling mechanism needs to be provided so as not to cause deterioration and damage of the electronic components due to heat production. Conventionally, a cooling mechanism adopting natural heat radiation by attaching a metallic heat radiation plate to each electronic component and radiating heat into the air after transferring the heat of the electronic components to the heat radiation plates, or a forcible heat radiation by exchanging air around the circuit boards by means of a cooling fan or a combination of these heat radiations.

On the other hand, there is a possibility that electromagnetic radiation noises produced by the electronic components on the circuit board leak to the outside and influence electronic products around. As a countermeasure to prevent the leakage of the electromagnetic radiation noises has been used a method according to which the circuit boards are accommodated in a metallic casing for shutting off the electromagnetic radiation noises. In such a case, the cooling fan installed for cooling the boards is often mounted in the metallic casing. In this way, the cooling fan is often disposed at a position distanced from the boards. Therefore, there have been problems of reducing cooling efficiency due to longer distances between the cooling fan and the circuit boards and enlarging the apparatus to provide an air blowing path.

As the miniaturization and the higher density of electronic apparatuses are required, electronic components have come to be mounted on boards with a higher density. Thus, a positional relationship between the cooling fan and the heat radiation plates or the respective electronic components cannot be sufficiently rationalized, whereby the heat radiation plates cannot be always disposed on the air blowing path. Therefore, there is a problem of being unable to obtain a sufficient cooling effect.

Accordingly, there have been proposed methods for efficiently cooling circuit boards. For example, Japanese Unexamined Patent Publication No. H08-125363 discloses a construction in which a cooling unit having an electric fan is mounted on an integrated circuit and the integrated circuit and the cooling unit are covered by a shielding element. This construction is designed to efficiently cool the integrated circuit and shield electromagnetic radiation noises. Further, Japanese Unexamined Patent Publication No. 2002-182545 discloses an image forming apparatus in which an air duct for dividing air blown onto wired boards by means of a cooling fan is provided on a holder cover for holding a contact member, thereby efficiently blowing air to heat-producing portions of the wired boards. Japanese Unexamined Patent Publication No. 2000-332474 discloses a method according to which, in an electronic-component cooling construction realized by fixing a heat sink (heat radiation plate) and a fan for cooling the heat sink to a circuit board, an air blowing path from the cooling fan and a lateral fin for guiding the air from the cooling fan sideways are provided on the heat sink.

However, the method disclosed in Japanese Unexamined Patent Publication No. H08-125363 requires a space for disposing the shielding element for covering the integrated circuit and the cooling unit. The method disclosed in Japanese Unexamined Patent Publication No. 2002-182545 also requires a space for disposing the cooling fan and the shielding member since the cooling fan is provided on the frame and electromagnetic waves are shielded by covering the wired board from above and below by means of the cooling fan and the shielding member. In either case, such a space hinders the miniaturization and the space-saving of the apparatus. Japanese Unexamined Patent Publication No. 2000-332474 does not refer to the countermeasure against the electromagnetic radiation noises at all.

SUMMARY OF THE INVENTION

An object of the present invention is to accomplish the space-saving, simply and inexpensively improve the cooling efficiency of electronic components on a board and effectively shield electromagnetic radiation noises in a cooling mechanism for a circuit board using a cooling fan.

In order to accomplish this object, one aspect of the present invention is directed to a cooling mechanism for a circuit board, comprising a board having electronic components disposed thereon; one or more heat radiation plates to be disposed on the board; a cooling fan for cooling the board and the electronic components disposed on the board by blowing air to at least one of the heat radiation plates; and a metal plate attached to one end of the board to ground the board, thereby preventing the leakage of electromagnetic radiation noises from the electronic components, wherein the metal plate includes a bent portion bent in L-shape along a lateral side of the board, the cooling fan is so disposed at the inner side of the bent portion as to be perpendicular to the board, and an air receiving surface of the heat radiation plate is so arranged as to be oblique to an axial blowing direction of the cooling fan.

According to this construction, the cooling fan is securely fixed, utilizing the bent portion of the metal plate. Further, the metal plate for preventing the leakage of noises and the cooling fan can be mounted on the board in a compact manner. Thus, the heat production and the leakage of electromagnetic noises from the circuit board can be simply and inexpensively suppressed. Further, the circuit board can be efficiently cooled by guiding the blown air to the heat radiation plates and the electronic components located at positions distanced from the axial blowing direction of the cooling fan. Furthermore, since there is no need for wiring that is required if the cooling fan is a separate part, it becomes easier to mount the cooling fan on the board and to mount the board in an apparatus main body.

DETAILED DESCRIPTION OF THE PREFERRED EMBODIMENTS

Figure 1:
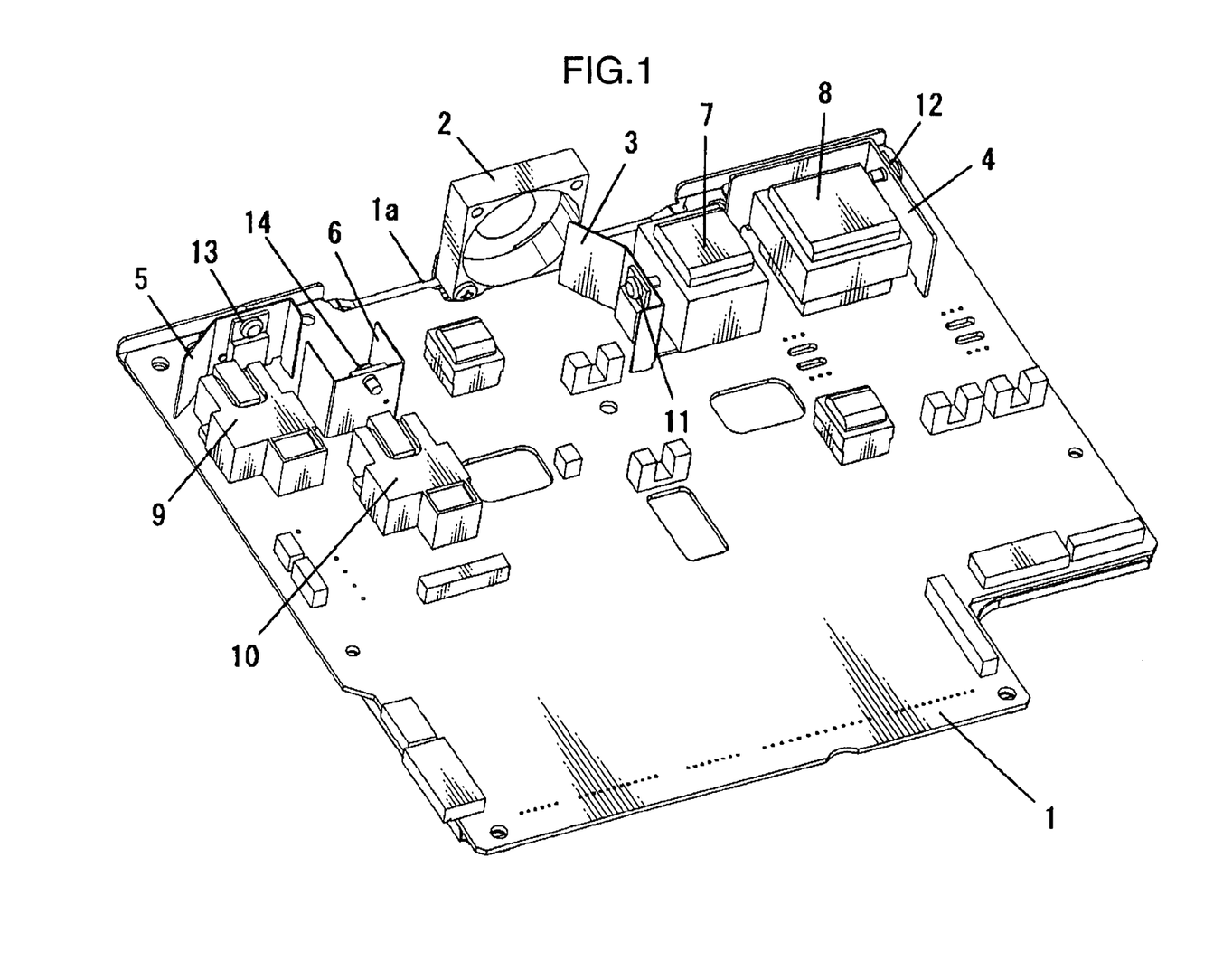
FIG. 1 is a schematic perspective view showing one example of a circuit board provided with a cooling mechanism according to a first embodiment of the invention.
Figure 2:
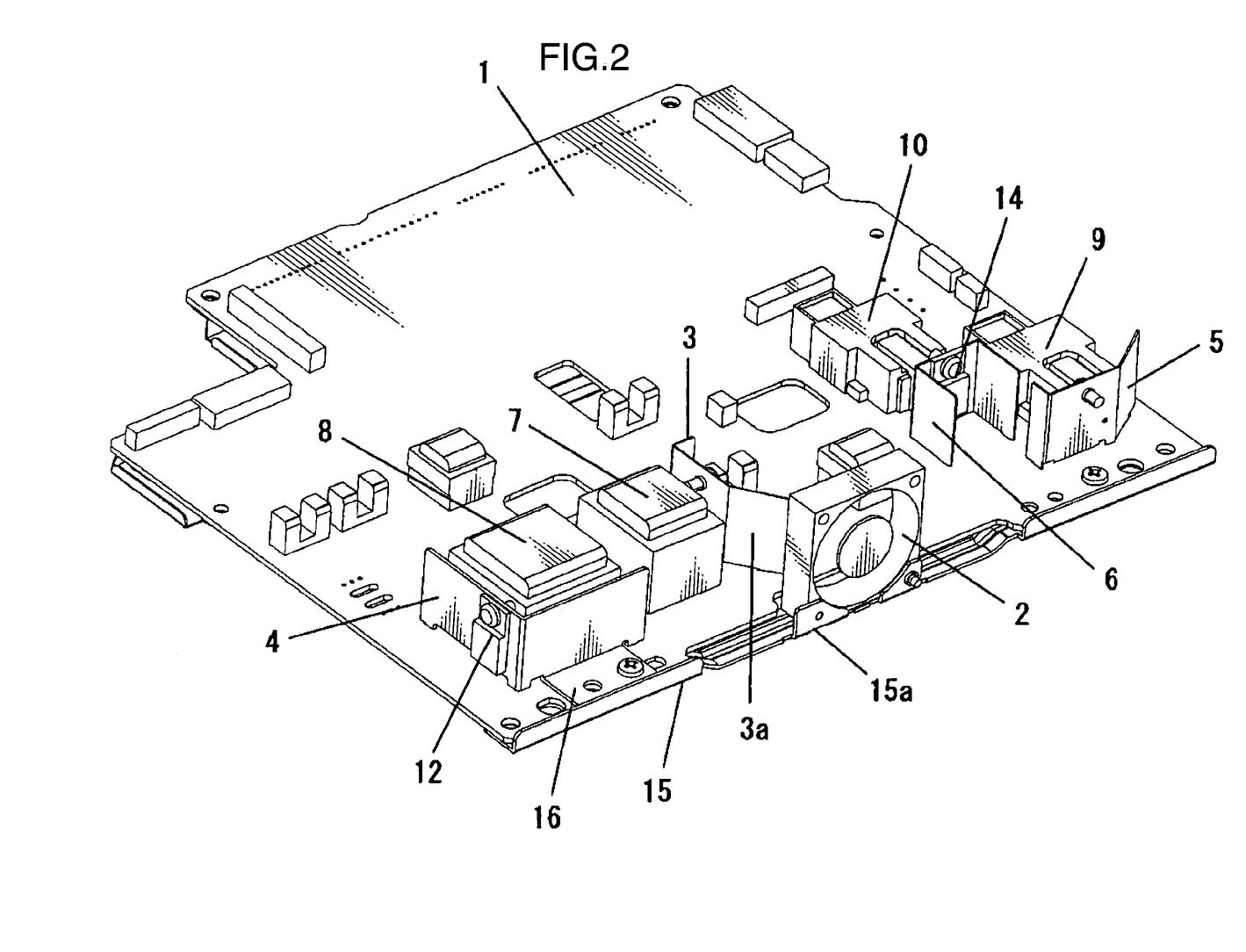
FIG. 2 is a schematic perspective view showing the circuit board provided with the cooling mechanism of the first embodiment when viewed in an opposite direction.

Hereinafter, embodiments of the present invention are described with reference to the accompanying drawings. FIGS. 1 and 2 are schematic perspective views showing one example of a circuit board provided with a cooling mechanism according to a first embodiment of the invention. This cooling mechanism includes a board 1 having various electronic components disposed thereon, a cooling fan 2 for cooling the electronic components by blowing air to the electronic components, and a noise preventing metal plate 15 for preventing the leakage of electromagnetic radiation noises from the electronic components.

The board 1 is a substantially rectangular flat board and has a notch 1a in the form of a shallow recess at an intermediate portion of one side edge. The cooling fan 2 is disposed in the notch 1a. Metallic heat radiation plates 3, 4, 5, 6 for radiating heats produced from the electronic components on the board 1 and transformers 7, 8, 9, 10 for converting an alternating-current voltage into a direct-current voltage are disposed on the upper surface of the board 1. Transistors 11, 12, 13, 14 are fixed to the corresponding heat radiation plates 3, 4, 5, 6. The heat radiation plates 3 to 6 radiate the heats produced from the transistors 11 to 14. The heats produced from the transformers 7 to 10 are transferred to the heat radiation plates 3 to 6 via the board 1, and these heats are also radiated by the heat radiation plates 3 to 6.

The cooling fan 2 includes a rotary fan, a frame member for rotatably holding the rotary fan, and a motor for rotating the rotary fan. Cooling air for cooling the electronic components is produced in an axial blowing direction of the rotary fan by rotating the rotary fan by means of the motor.

The noise preventing metal plate 15 prevents the leakage of electromagnetic radiation noises radiated from the electronic components such as the transformers 7 to 10 by grounding the board 1. The noise preventing metal plate 15 is located on the lower surface of the board 1 and is so attached to one entire side of the board 1 as to touch a metal member such as a frame when the board 1 is mounted in an apparatus. It should be noted that other electronic components and circuits such as choke coils are also disposed on the upper surface of the board 1, but they are not described here to facilitate the description.

Essentials of the construction according to the first embodiment are as follows. The noise preventing metal plate 15 is formed with an L-shaped bent portion 15a along the side of the board 1. The cooling fan 2 is mounted on the inner surface of the bent portion 15a, and so disposed at the position of the notch 1a of the board 1 as to be perpendicular to the board 1. An air receiving surface 3a of the heat radiation plate 3 located on an air blowing path of the cooling fan 2 is arranged to be oblique to the axial blowing direction of the cooling fan 2.

Figure 3:
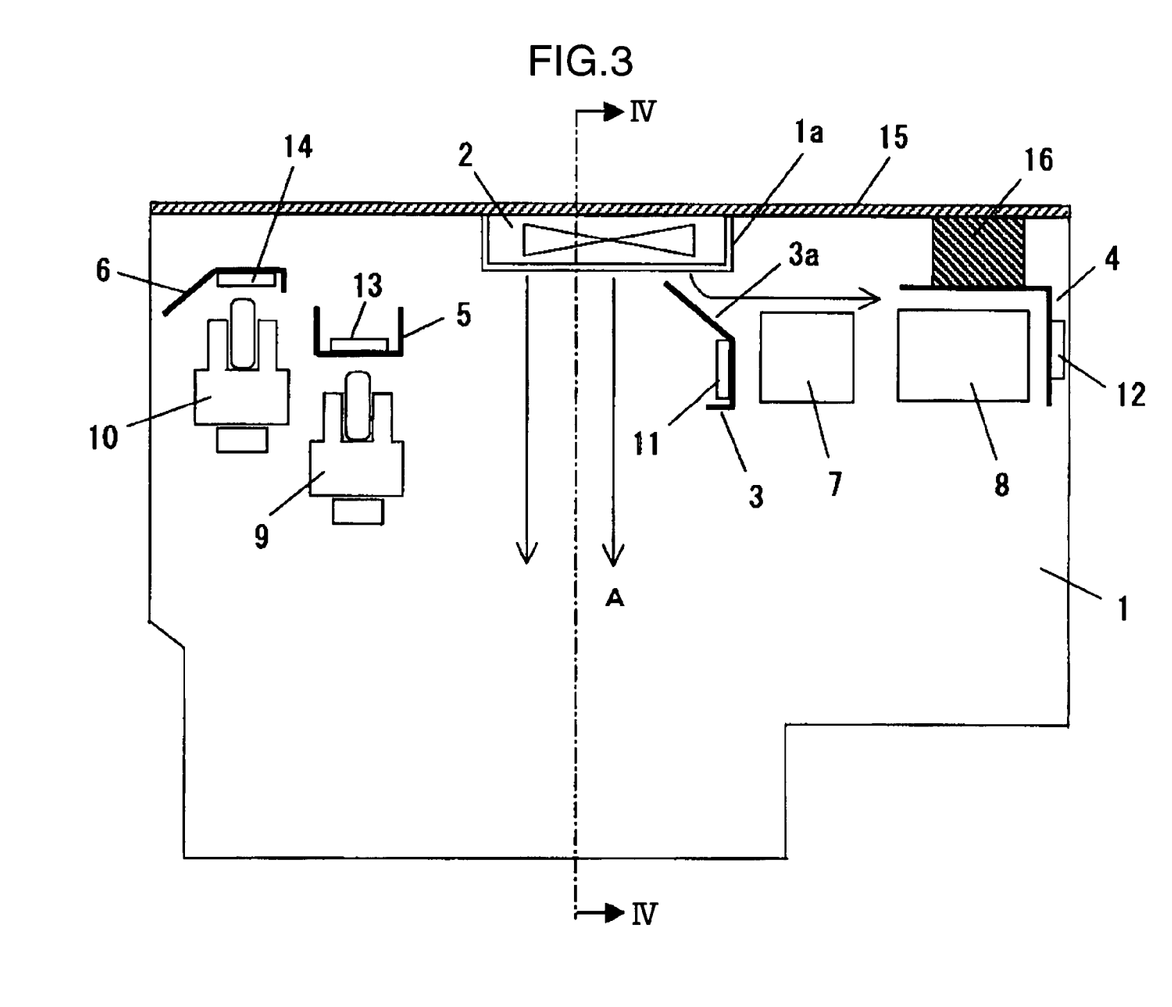
FIG. 3 is a plan view showing the circuit board provided with the cooling mechanism of the first embodiment.

FIG. 3 is a plan view of a circuit board provided with the cooling mechanism of the first embodiment. Parts common to FIGS. 1 and 2 are identified by the same reference numerals and not described. Here, it is assumed that the transformers 7 and 8 produce larger amounts of heat than the transformers 9 and 10 and the heat radiation plates 3, 4 reach higher temperatures than the heat radiation plates 5, 6 by being influenced by the heat production of the transformers 7, 8. Since the air blown from the cooling fan 2 directly strikes against the heat radiation plate 3 disposed near the middle part of the board 1, heat radiation efficiency by the heat radiation plate 3 is higher. However, the heat radiation plate 4 disposed near an end of the board 1 is located at a position distanced from the axial blowing direction (direction of arrow A in FIG. 3) of the cooling fan 2, the air blown from the cooling fan 2 cannot be let to directly strike against the heat radiation plate 4.

Accordingly, the heat radiation plate 3 is disposed such that the air blown from the cooling fan 2 obliquely strikes against the air receiving surface 3a, whereby the air blowing path is divided into the direction of arrow A and a direction toward a side where the heat radiation plate 4 and the transformers 7, 8 are disposed. This point is described in detail. The heat radiation plate 3 is a member formed by bending a substantially rectangular flat plate at the substantially middle position by 45°, and this bent part serves as the air receiving surface 3a. The heat radiation plate 3 is mounted on the upper surface of the board 1 such that an end edge of the air receiving surface 3a is located in an air blowing area extending in the direction of arrow A from the cooling fan 2 and extends in a direction more away from the direction of arrow A.

As a result of such an arrangement, part of the wind produced by the cooling fan 2 obliquely strikes against the air receiving surface 3a and is guided thereby to travel outward. Then, this part of the wind strikes against the heat radiation plate 4 and the transformers 7, 8. In other words, the cooling air can be let to directly strike against the heat radiation plate 4 and the transformers 7, 8 mounted at positions distanced from the air blowing area of the cooling fan 2 extending in the direction of arrow A. This can improve the heat radiation efficiency of the heat radiation plate 4 and can directly lower the temperatures of the transformers 7, 8 producing larger amounts of heat.

Further, in this embodiment, the cooling fan 2 is mounted on the bent portion 15a formed at the noise preventing metal plate 15. This enables the cooling fan 2 to be securely fixed and enables the noise preventing metal plate 15 and the cooling fan 2 to be mounted in a compact manner.

There is no particular limitation in the material for the heat radiation plates 3 to 6 provided that the material has a high heat conductivity. For example, various metal materials such as aluminum, copper and steel can be used as such. The sizes, shapes and thicknesses of the heat radiation plates 3 to 6 can be suitably set in accordance with the shapes, the heat producing amounts and the like of the electronic components disposed on the board 1.

Although the example is described here in which the angle of the air receiving surface 3a with respect to the axial blowing direction of the cooling fan 2 is set at substantially 45° as described above to form the air blowing path at right angle to the axial blowing direction, the present invention is not limited thereto. The angle of the air receiving surface 3a can be arbitrarily set such that an air blowing path newly formed by the air receiving surface 3a is guided to the other heat radiation plates or electronic components disposed at a downstream side of the air blowing direction.

The heat radiation plate 4 is coupled to the noise preventing metal plate 15 via a coupling portion 16, whereby the heat of the heat radiation plate 4 is transferred to the noise preventing metal plate 15 via the coupling portion 16. Specifically, the heat radiation plate 4, the noise preventing metal plate 15 and the coupling portion 16 fulfills a function of a large heat radiation plate as an integral unit. As a result, the heat can be more effectively radiated from the heat radiation plate 4, against which the air blown from the cooling fan 2 is unlikely to strike as compared to the heat radiation plate 3 and which has a low heat radiation effect. This coupling portion 16 is also made of a metal having a high heat conductivity similar to the heat radiation plates.

Figure 4:
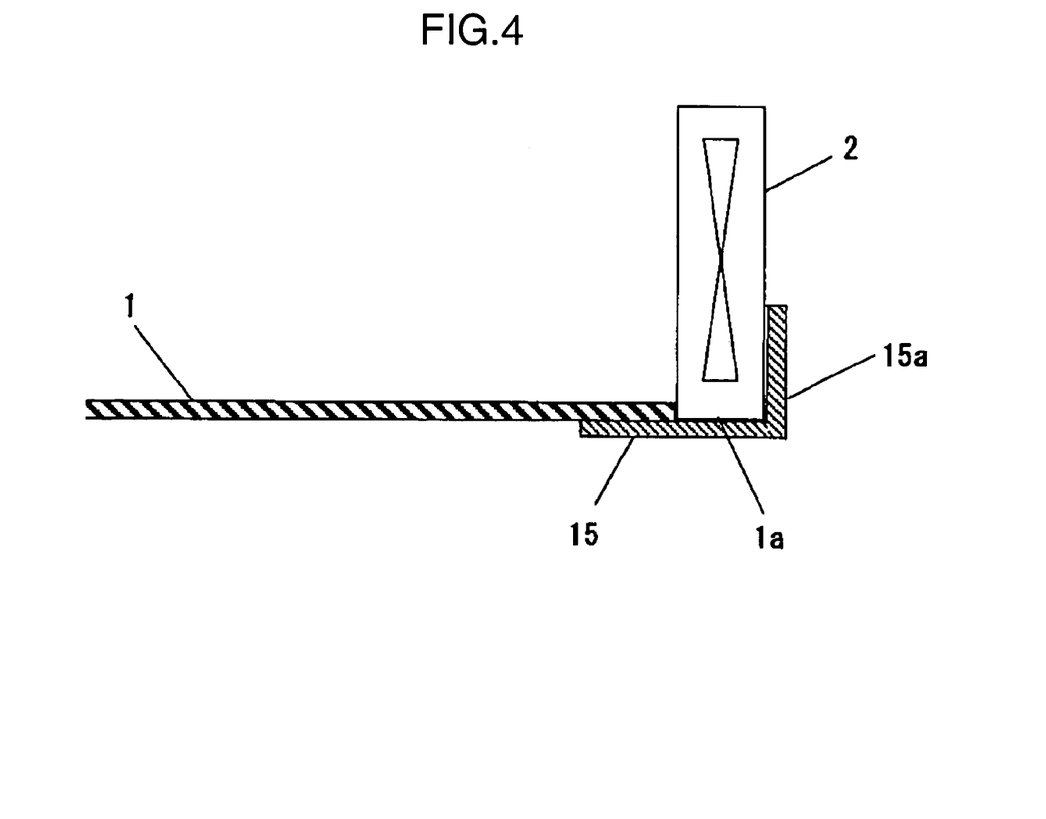
FIG. 4 is a partial section showing the circuit board provided with the cooling mechanism of the first embodiment.

FIG. 4 is a partial section (section along IV-IV of FIG. 3) of the board 1 provided with the cooling mechanism of the first embodiment. The cooling fan 2 is so disposed along the inner surface of the bent portion 15a as to be perpendicular to the board 1, and the notch 1a is formed at a part of the board 1 where the cooling fan 2 is disposed. Thus, the cooling fan 2 is accommodated in a space within the board 1 when viewed in a plane, and a space is increased only in height direction by as much as the height of the cooling fan 2. Thus, a spatial loss caused by the mounting of the cooling fan 2 is minimizedly suppressed, thereby realizing the miniaturization and the space-saving of the apparatus.

Figure 5:
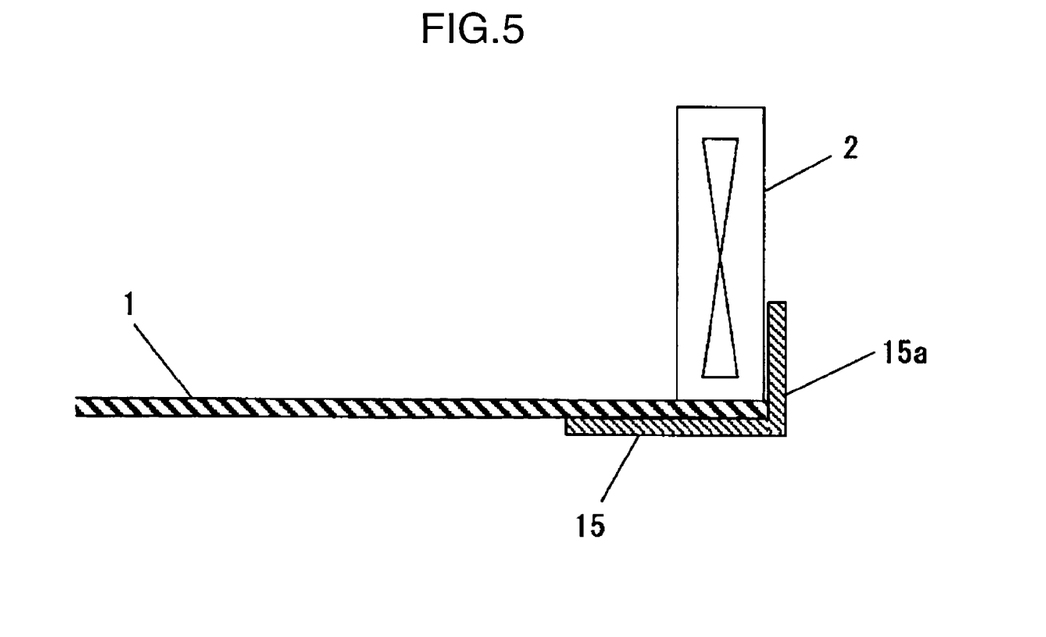
FIG. 5 is a partial section showing another construction of the circuit board provided with the cooling mechanism of the first embodiment.

Since the above construction is equivalent to the one in which the cooling fan 2 is directly mounted on the board 1, there is no need for wiring required when the cooling fan 2 is a separate part. Accordingly, it becomes easier to mount the cooling fan 2 on the board 1 and to mount the board 1 in the apparatus. It should be noted that the cooling fan 2 may be disposed on the board 1 without providing the board 1 with the notch 1a as shown in FIG. 5. However, in the case of providing the notch 1a as shown in FIG. 4, the cooling fan 2 can be stably disposed while being enclosed by the defining edges of the notch 1a and the bent portion 15a, and a better space-saving effect can be obtained by as much as the thickness of the board 1. Therefore, this is more preferable.

Figure 6A:
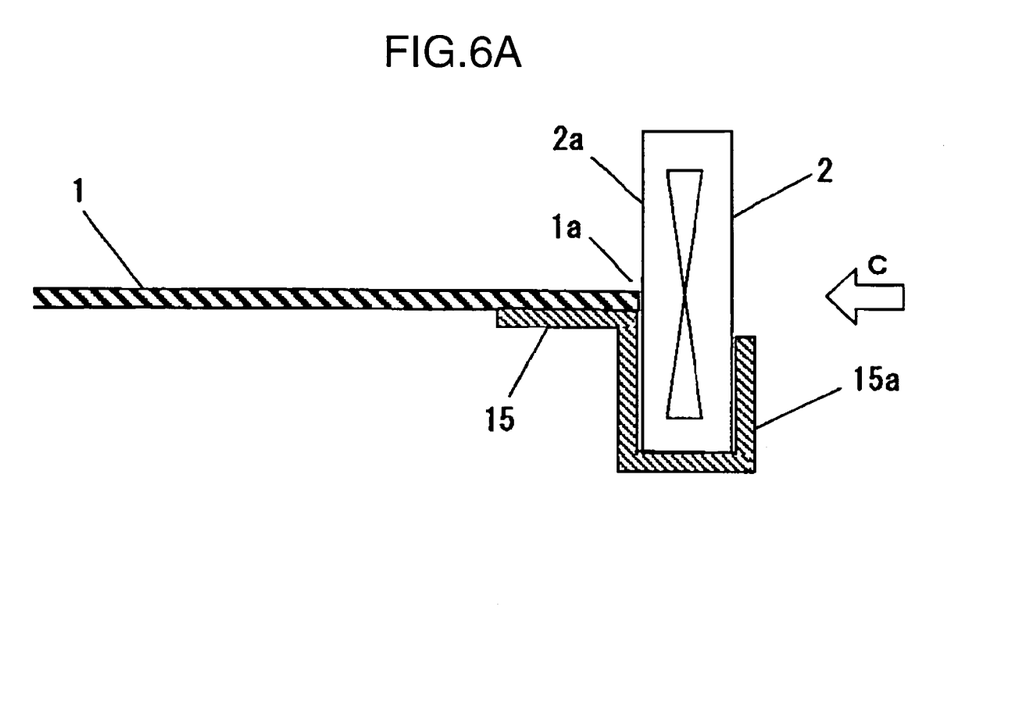
FIG. 6A is a partial section showing a circuit board provided with a cooling mechanism according to a second embodiment of the invention.
Figure 6B:
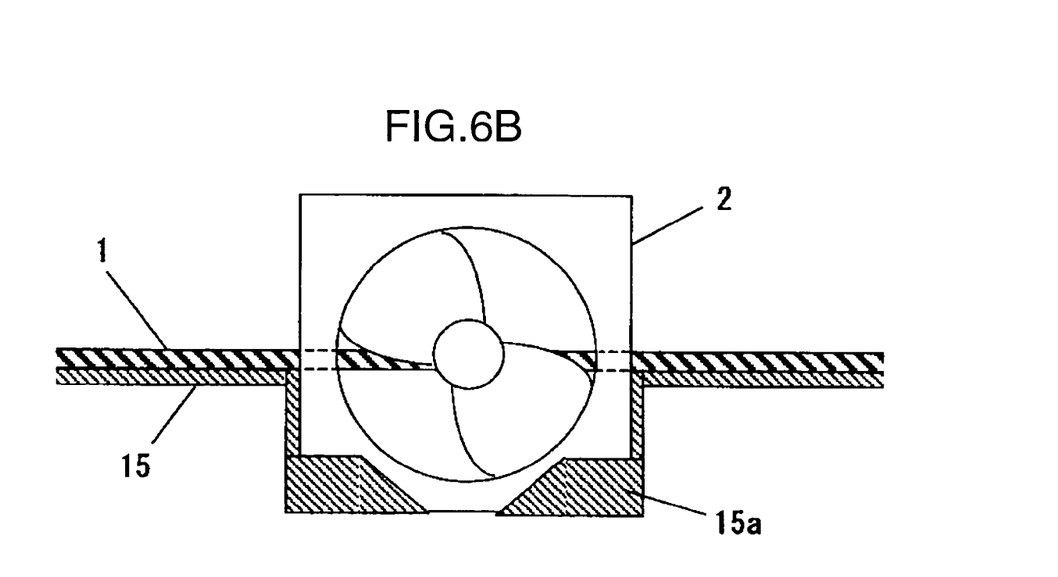
FIG. 6B is a partial side view of the circuit board of FIG. 6A when viewed from a side of the cooling fan.

Next, a second embodiment of the present invention is described. FIG. 6A is a partial section showing a circuit board provided with a cooling mechanism according to a second embodiment of the present invention, and FIG. 6B is a partial side view of the circuit board when viewed from a side of a cooling fan (in a direction of arrow C of FIG. 6A). In this embodiment, a bent portion 15a of a noise preventing metal plate 15 projects from the underside of the board 1 (toward a lower side in FIGS. 6A, 6B). This projecting distance is substantially half the height of the cooling fan 2. An air blowing surface 2a of the cooling fan 2 is divided into two upper and lower sections by the board 1 by being mounted on such a bent portion 15a. In other words, an end edge of the board 1 is arranged to face the substantially middle part of the cooling fan 2 with respect to height direction. Since the other construction is common to the first embodiment, it is not described. Here, the heat radiation plates 3 to 6, the transformers 7 to 10 and the like are neither described nor shown.

By this construction, air can be blown to the opposite top and under sides of the board 1 by the cooling fan 2. If heat radiation plates or electronic components are disposed also on the underside of the board 1, they can be efficiently cooled. It should be noted that the shape of the bent portion 15a shown in FIGS. 6A, 6B is merely an example, and any shape can be adopted provided that the air blowing surface 2a is divided into two sections by the board 1.

Figure 7:
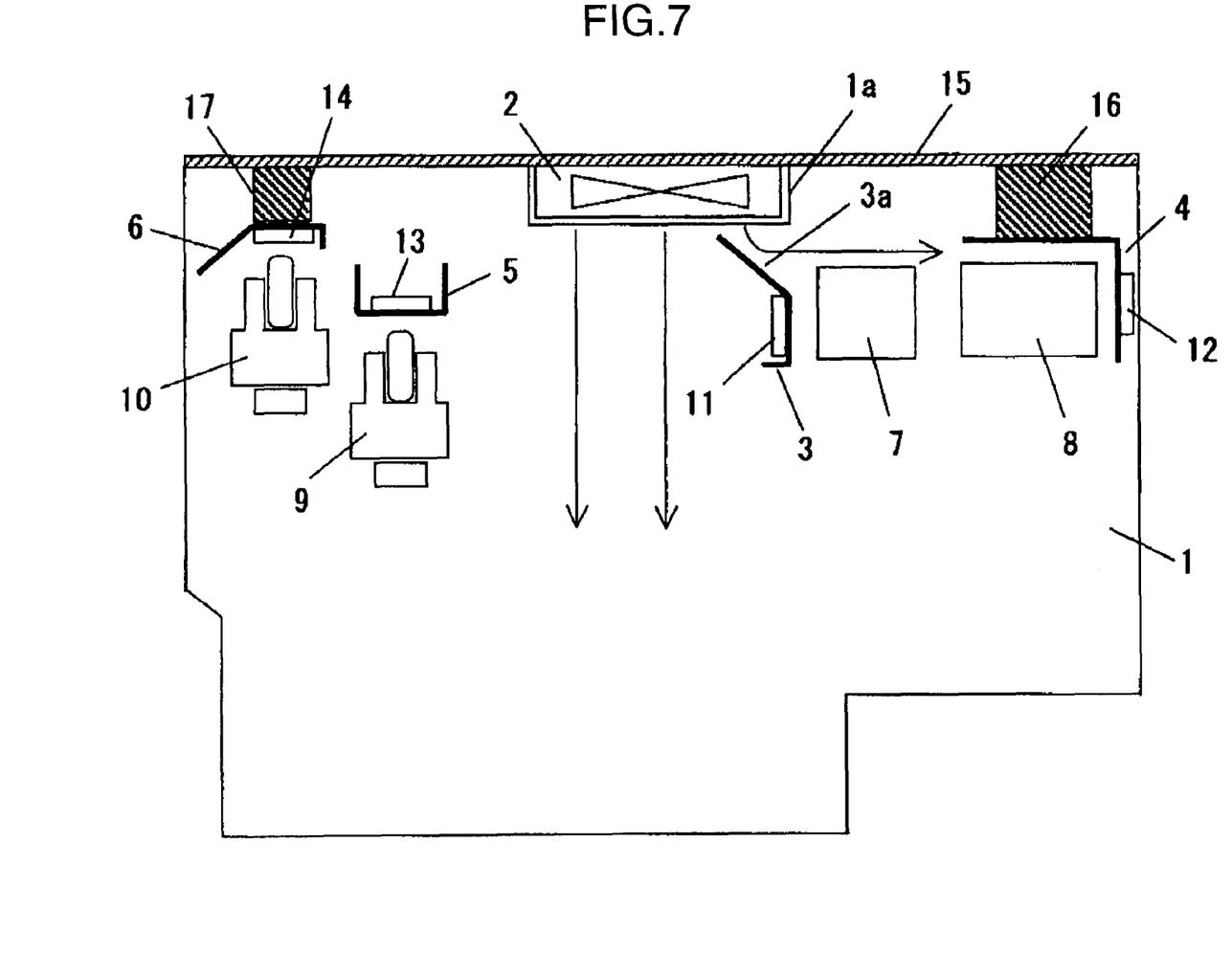
FIG. 7 is a plan view showing a circuit board provided with a cooling mechanism according to a third embodiment of the invention.

Next, a third embodiment of the present invention is described. FIG. 7 is a plan view of a circuit board provided with a cooling mechanism according to the third embodiment of the present invention. Portions common to those of the first embodiment shown in FIG. 3 are identified by the same reference numerals and not described. In this embodiment, the heat radiation plate 6 and the noise preventing metal plat 15 are coupled via a coupling portion 17 in addition to the construction of the first embodiment.

By this construction, the heat radiation plate 6 is coupled to the heat radiation plate 4 via the coupling portion 17, the noise preventing metal plate 15 and the coupling portion 16. Specifically, the heat radiation plate 6 is integral to the coupling portion 17, the noise preventing metal plate 15, the coupling portion 16 and the heat radiation plate 4, thereby fulfilling a function of one large heat radiation plate. Thus, the heat can be efficiently radiated from the heat radiation plate 6 against which air blown from the cooling fan 2 does not strike. Further, since the heat radiation plate 4 has a high heat radiation effect by receiving the air blown from the cooling fan 2 and guided via the air receiving surface 3a of the heat radiation plate 3, the heat transferred from the heat radiation plate 6 against which the air does not strike can be more efficiently radiated.

Although the heat radiation plate 6 and the noise preventing metal plate 15 are coupled by the coupling portion 17 in this embodiment, the heat radiation plate 5 may be coupled instead of the heat radiation plate 6 or both heat radiation plates 5 and 6 may be coupled. Further, if the heat radiation plate 3 directly receiving the air blown from the cooling fan 2 is similarly coupled to the noise preventing metal plate 15, the cooling mechanism comes to possess an even higher heat radiation effect.

The present invention is not limited to the foregoing embodiments, and various changes can be made without departing from the scope and spirit of the present invention. For example, constructions realized by combining the respective foregoing embodiments are, of course, also embraced by the scope of the present invention. Further, there are no restrictions on the number and the disposed positions of the cooling fan, the heat radiation plates and electronic components, and they can be suitably designed in accordance with the construction of the circuit board.

The inventive cooling mechanism for the circuit board can be installed in image forming apparatuses such as copiers, facsimile apparatuses, scanners and laser printers or electronic apparatuses such as televisions and personal computers. The installation of this cooling mechanism can effectively suppress the heat production of the circuit boards and the production of electromagnetic radiation noises and contribute to the miniaturization and the space-saving of these apparatuses.

The present invention relates to a circuit-board cooling mechanism for cooling a board and electronic components disposed on the board, the cooling mechanism comprising one or more heat radiation plates disposed on the board, and a cooling fan for blowing air to at least one of the heat radiation plates. A metal plate for preventing the leakage of electromagnetic radiation noises from the electronic components by grounding the board is attached to one end of the board, and a bent portion is formed by bending the metal plate in L-shape along the board. Further, the cooling fan is so disposed at the inner side of the bent portion as to be perpendicular to the board, and an air receiving surface of the heat radiation plate is so arranged as to be oblique to an axial blowing direction of the cooling fan.

This construction realizes secure fixation of the cooling fan to the bent portion and the mounting of the noise preventing metal plate and the cooling fan in a compact manner. Thus, a large space is not necessary to dispose the cooling fan and the noise preventing metal plate and it can be made possible to provide a simple and inexpensive circuit-board cooling mechanism capable of suppressing the heat production from a circuit board and the leakage of electromagnetic radiation noises. Further, air blown from the cooling fan can be also guided to the heat radiation plates and electronic components which are located at positions distanced from the axial blowing direction of the cooling fan and against which the blown air does not directly strike, wherefore the circuit board can be efficiently cooled. Furthermore, since no wiring is necessary to connect the cooling fan and the board, it becomes easier to mount the cooling fan on the board and to mount the board in an apparatus main body.

Since a notch is formed in a portion where the cooling fan is disposed, the cooling fan is accommodated in a space within the board when viewed in a plane, whereby the miniaturization and the space-saving of an apparatus are realized by suppressing a spatial loss caused by the mounting of the cooling fan to a minimum level. Further, since the cooling fan can be disposed in an area enclosed by the notch and the bent portion, it can be securely fixed.

If the cooling fan is so disposed as to be able to blow air at the opposite top and under sides of the board, the heat radiation plates and the electronic components disposed on the underside of the board can also be cooled, thereby further improving a cooling efficiency. Further, if air blowing paths are defined in conformity with the arrangement of the heat radiation plates and the electronic components by adjusting an angle of the air receiving surface, the cooling efficiency by the cooling fan can be further improved.

If the heat radiation plate(s) and the metal plate are coupled to form one large heat radiation plate as a whole, a heat radiation effect can be further improved. Further, by coupling the heat radiation plate for receiving the blown air to the other heat radiation plates, against which no blown air strikes, via the metal plate and the coupling portion, differences among the heat radiation efficiencies of the respective heat radiation plates can be made smaller, thereby improving the overall heat radiation efficiency.

This application is based on Japanese Patent Application No. 2005-245145 filed on Aug. 26, 2005, the contents of which are hereby incorporated by reference.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A cooling mechanism for a circuit board, comprising:
a board having electronic components disposed thereon,
a cooling fan disposed in a side-end portion of the board so as to be perpendicular to the board for cooling the board and the electronic components disposed on the board by blowing air,
a heat radiation plate located on an air blowing path of the cooling fan on the board, and including an air receiving surface for receiving air blown from the cooling fan,
a metal plate attached to one end of the board for preventing a leakage of electromagnetic radiation noise from the electronic components by grounding the board, and
a coupling portion for coupling the heat radiation plate and the metal plate,
the heat radiation plate being formed by bending a rectangular plate to define
at least first and second panels and a bend therebetween, the first panel having an air receiving surface arranged oblique to an axial blowing direction of the cooling fan, and
at least one of the electronic components being mounted on the second panel of the heat radiation plate.

2. A cooling mechanism according to claim 1, wherein a notch is formed in a portion of the board where the cooling fan is disposed.

3. A cooling mechanism according to claim 1,
wherein at least a part of the first panel of the heat radiation plate projects at the top side or under side of the board, and the cooling fan is disposed such that an air blowing surface is divided by the board.

4. A cooling mechanism according to claim 1,
wherein the heat radiation plate is a first heat radiation plate, and wherein the cooling mechanism further includes a second heat radiation plate, an angle of the air receiving surface to the axial blowing direction of the cooling fan is set such that air blown from the cooling fan is guided to the second heat radiation plate and/or the electronic components disposed at a downstream side of an air blowing direction.

5. A cooling mechanism according to claim 1, wherein:
the air receiving surface is disposed for receiving air blown from the cooling fan, the air receiving surface being oriented such that an upstream edge of the air receiving surface in an air blowing direction is located closer to a center of an air blown area of the cooling fan, and a downstream edge of the air receiving surface in the air blowing direction is located away from the center of the air blown area.

6. A cooling mechanism comprising:
a board having electronic components disposed thereon,
at least first and second heat radiation plates disposed on the board,
a cooling fan for cooling the board and the electronic components disposed on the board by blowing air to at least the first heat radiation plate, and
a metal plate attached to one end of the board to ground the board, thereby preventing a leakage of electromagnetic radiation noises from the electronic components,
wherein: the metal plate includes a bent portion bent in an L-shape along a lateral side of the board,
the cooling fan is disposed at an inner side of the bent portion and is perpendicular to the board,
an air receiving surface of the first heat radiation plate is oblique to an axial blowing direction of the cooling fan, and
a coupling portion is coupled to the second heat radiation plate and the metal plate.

* * * * *